(12) United States Patent
Kwon et al.

(10) Patent No.: US 12,341,015 B2
(45) Date of Patent: Jun. 24, 2025

(54) APPARATUS FOR POLISHING A WAFER AND METHOD FOR FABRICATING A SEMICONDUCTOR DEVICE USING THE SAME

(71) Applicant: Samsung Electronics Co., Ltd., Suwon-si (KR)

(72) Inventors: Dong Hoon Kwon, Hwaseong-si (KR); Chung Ki Min, Hwaseong-si (KR); Bo Un Yoon, Seoul (KR); Ki Hoon Jang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 281 days.

(21) Appl. No.: 17/842,962

(22) Filed: Jun. 17, 2022

(65) Prior Publication Data
US 2023/0170222 A1 Jun. 1, 2023

(30) Foreign Application Priority Data
Nov. 26, 2021 (KR) .................. 10-2021-0165144

(51) Int. Cl.
*B24B 37/10* (2012.01)
*B24B 37/04* (2012.01)
(Continued)

(52) U.S. Cl.
CPC ...... *H01L 21/30625* (2013.01); *B24B 37/042* (2013.01); *B24B 37/10* (2013.01); *B24B 53/017* (2013.01); *B24B 57/02* (2013.01)

(58) Field of Classification Search
CPC ......... B24B 7/228; B24B 37/34; B24B 37/04; B24B 37/08; B24B 37/10; B24B 37/105;
(Continued)

(56) References Cited

U.S. PATENT DOCUMENTS 5,081,051 A * 1/1992 Mattingly ............. B24B 53/017
438/693
5,216,843 A * 6/1993 Breivogel ............... B24B 37/26
451/36
(Continued)

FOREIGN PATENT DOCUMENTS

KR 20010008429 A 2/2001
KR 20010037313 A 5/2001
(Continued)

*Primary Examiner* — Brian D Keller
*Assistant Examiner* — Marcel T Dion
(74) *Attorney, Agent, or Firm* — Muir Patent Law, PLLC

(57) ABSTRACT

A method for fabricating a semiconductor device includes providing a polishing pad which includes a first region and a second region separated from each other by a fence, loading a wafer onto the first region, providing a slurry solution onto the first region, providing an ultrapure water onto the second region, turning the polishing pad to polish a surface of the wafer, and unloading the wafer from the polishing pad after polishing on the surface of the wafer is completed, wherein the fence includes a first fence extending from a center of the polishing pad toward an edge of the polishing pad in a first horizontal direction, and a second fence extending from the center of the polishing pad toward the edge of the polishing pad in a second horizontal direction different from the first horizontal direction.

11 Claims, 13 Drawing Sheets

(51) Int. Cl.
  *B24B 53/017*     (2012.01)
  *B24B 57/02*      (2006.01)
  *H01L 21/306*     (2006.01)

(58) Field of Classification Search
  CPC ..... B24B 37/107; B24B 37/26; B24B 53/017; B24B 57/02
  USPC .................................... 451/56, 72, 443, 446
  See application file for complete search history.

(56) References Cited

U.S. PATENT DOCUMENTS

| | | | | |
|---|---|---|---|---|
| 5,645,682 | A * | 7/1997 | Skrovan | B24B 53/017 438/692 |
| 5,651,725 | A * | 7/1997 | Kikuta | B24B 53/00 451/286 |
| 6,193,587 | B1 * | 2/2001 | Lin | B24D 13/145 451/287 |
| 6,213,852 | B1 * | 4/2001 | Fujii | B24B 57/02 451/446 |
| 6,429,131 | B2 * | 8/2002 | Lin | B24B 37/04 438/692 |
| 6,468,134 | B1 * | 10/2002 | Gotkis | B24B 53/017 451/36 |
| 6,500,054 | B1 * | 12/2002 | Ma | B24B 53/017 451/529 |
| 6,800,020 | B1 * | 10/2004 | Boyd | B24B 21/04 451/72 |
| 6,866,566 | B2 * | 3/2005 | Taylor | B24B 53/017 451/53 |
| 9,108,293 | B2 * | 8/2015 | Nunley, Jr. | B24B 7/228 |
| 2003/0068959 | A1 * | 4/2003 | Kajiwara | B24B 57/02 451/41 |
| 2003/0207654 | A1 * | 11/2003 | Hamayasu | B24B 37/04 451/36 |
| 2017/0368664 | A1 * | 12/2017 | Yang | B24B 37/10 |
| 2019/0193245 | A1 | 6/2019 | Tregub et al. | |

FOREIGN PATENT DOCUMENTS

| | | |
|---|---|---|
| KR | 20040070580 A | 8/2004 |
| KR | 20040070595 A | 8/2004 |
| KR | 20050063346 A | 6/2005 |
| KR | 20100052028 A | 5/2010 |
| KR | 20130132480 A | 12/2013 |
| KR | 20170049926 A | 5/2017 |

* cited by examiner

APPARATUS FOR POLISHING A WAFER AND METHOD FOR FABRICATING A SEMICONDUCTOR DEVICE USING THE SAME

CROSS-REFERENCE TO RELATED APPLICATION

This application claims priority under 35 U.S.C. 119 to Korean Patent Application No. 10-2021-0165144 filed on Nov. 26, 2021 in the Korean Intellectual Property Office, the contents of which in its entirety are herein incorporated by reference.

BACKGROUND

1. Technical Field

The present disclosure relates to an apparatus for polishing a wafer and a method for fabricating a semiconductor device using the same.

2. Description of the Related Art

In a general chemical mechanical polishing (CMP) process, a frictional heat is generated due to friction between a polishing head, a wafer and a polishing pad. Accordingly, a temperature of fluid (e.g., slurry solution) on the polishing pad may increase. In a conditioning process for restoring a surface of the polishing pad, the fluid having increased temperature may accelerate wear of a disc, which continues to rub against the polishing pad. For this reason, there is a problem that variability of the CMP process increases, and productivity of the process decreases due to frequent replacement of consumables.

SUMMARY

Aspects of the present disclosure provide a wafer polishing apparatus in which an upper surface of a polishing pad is completely separated into a first region in which a polishing process on a surface of the wafer is performed, and a second region in which a disc is disposed, by the use of a fence, to prevent the disc from being etched by the slurry solution, thereby reducing the variability of the polishing process, and increasing the replacement cycle of the disc to improve the productivity, and a method for fabricating a semiconductor device using the wafer polishing apparatus.

According to an exemplary embodiment of the present disclosure, a method for fabricating a semiconductor device includes providing a polishing pad which includes a first region and a second region separated from each other by a fence, loading a wafer onto the first region, providing a slurry solution onto the first region, providing an ultrapure water onto the second region, turning the polishing pad to polish a surface of the wafer, and unloading the wafer from the polishing pad after polishing on the surface of the wafer is completed, wherein the fence includes a first fence extending from a center of the polishing pad toward an edge of the polishing pad in a first horizontal direction, and a second fence extending from the center of the polishing pad toward the edge of the polishing pad in a second horizontal direction different from the first horizontal direction.

According to an exemplary embodiment of the present disclosure, an apparatus for polishing a wafer includes a polishing pad which includes a first region to which a slurry solution is provided, and a second region to which an ultrapure water is provided, a first fence which is disposed on the polishing pad, and extends from a center of the polishing pad toward an edge of the polishing pad in a first horizontal direction, a second fence which is disposed on the polishing pad, and extends from the center of the polishing pad toward the edge of the polishing pad in a second horizontal direction different from the first horizontal direction, and a polishing head which is disposed on the first region and onto which a wafer is loaded, wherein the first and second regions are formed by and separated by the first and second fences.

According to an exemplary embodiment of the present disclosure, there is provided an apparatus for polishing a wafer, comprising a polishing pad which includes a first region and a second region completely separated from the first region, a fence which is disposed on the polishing pad and separates the first region and the second region, a first nozzle configured to provide a slurry solution to the first region, a second nozzle configured to provide an ultrapure water to the second region, a polishing head which is disposed on the first region and onto which a wafer is loaded, and a disc which is disposed on the second region and is configured to form a plurality of grooves on an upper surface of the polishing pad.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail exemplary embodiments thereof referring to the attached drawings, in which.

DETAILED DESCRIPTION OF THE EMBODIMENTS

Hereinafter, a wafer polishing apparatus according to some embodiments of the present disclosure will be described referring to FIGS. 1 to 7.

Figure 1:
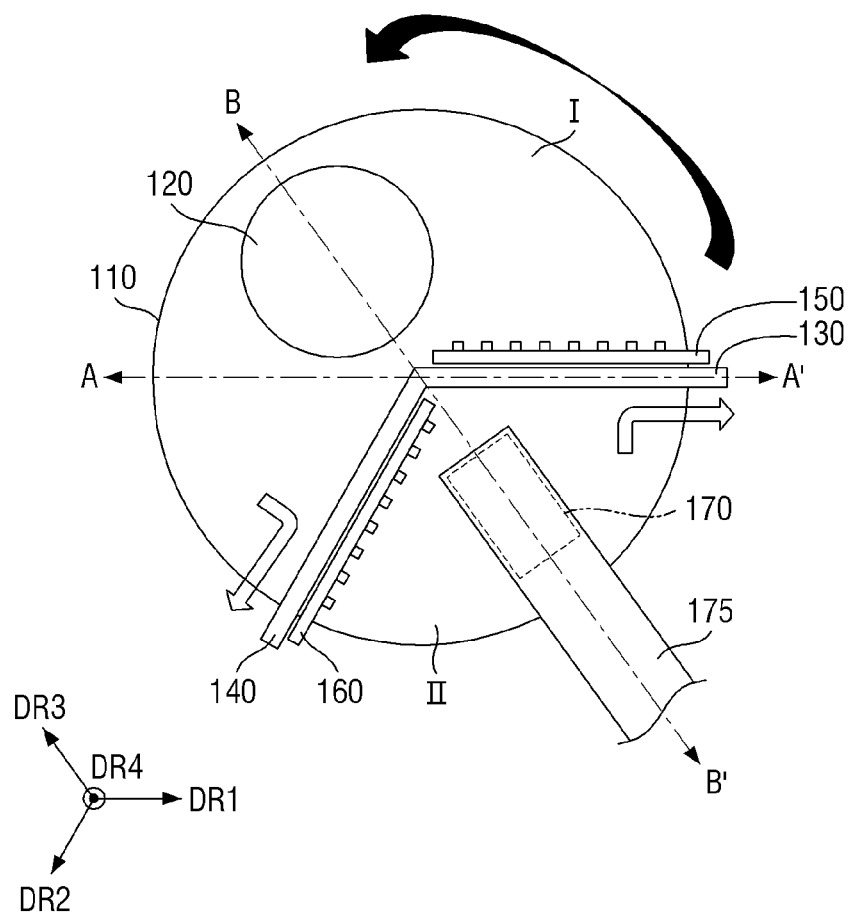
FIG. 1 is a plan view for explaining a wafer polishing apparatus according to some embodiments of the present disclosure.
Figure 2:
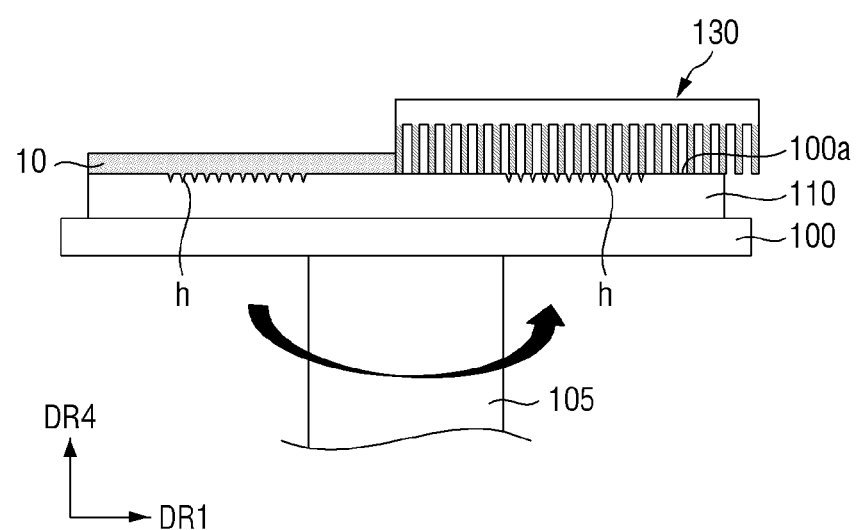
FIG. 2 is a cross-sectional view taken along a line A-A' of FIG. 1, according to some embodiments.
Figure 3:
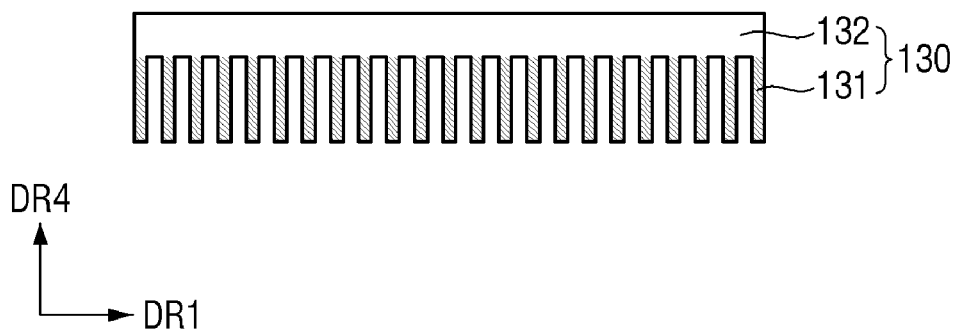
FIG. 3 is a cross-sectional view for explaining a first fence of a wafer polishing apparatus shown in FIG. 2, according to some embodiments.
Figure 4:
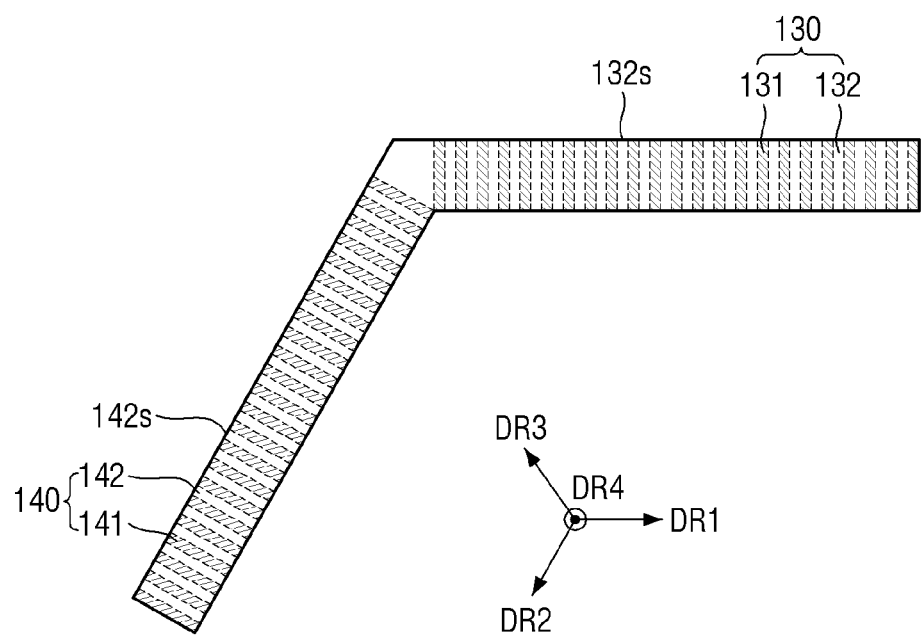
FIG. 4 is a plan view for explaining a first fence and a second fence of the wafer polishing apparatus shown in FIG. 1, according to some embodiments.
Figure 5:
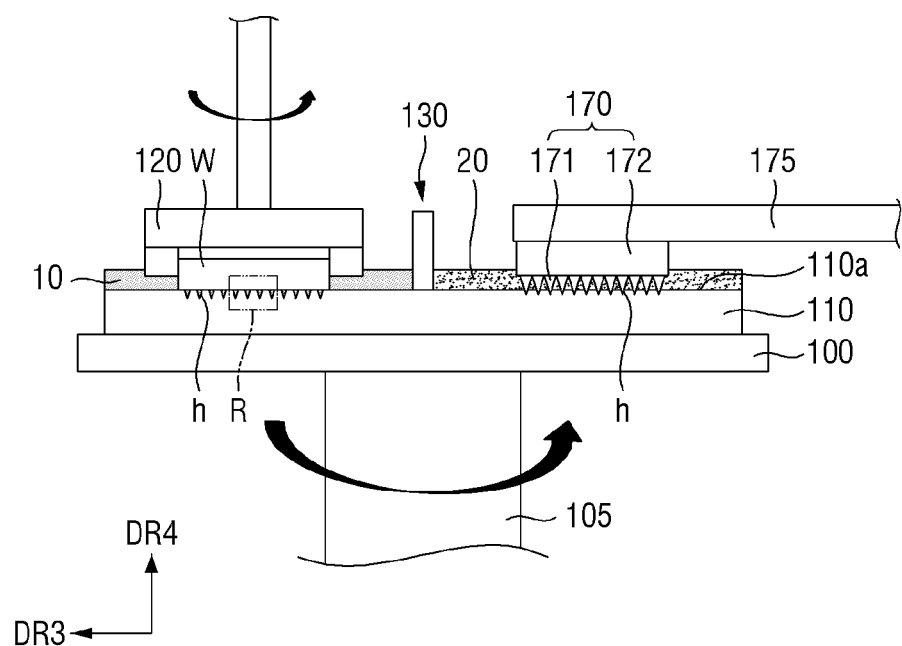
FIG. 5 is a cross-sectional view taken along a line B-B' of FIG. 1, according to some embodiments.
Figure 6:
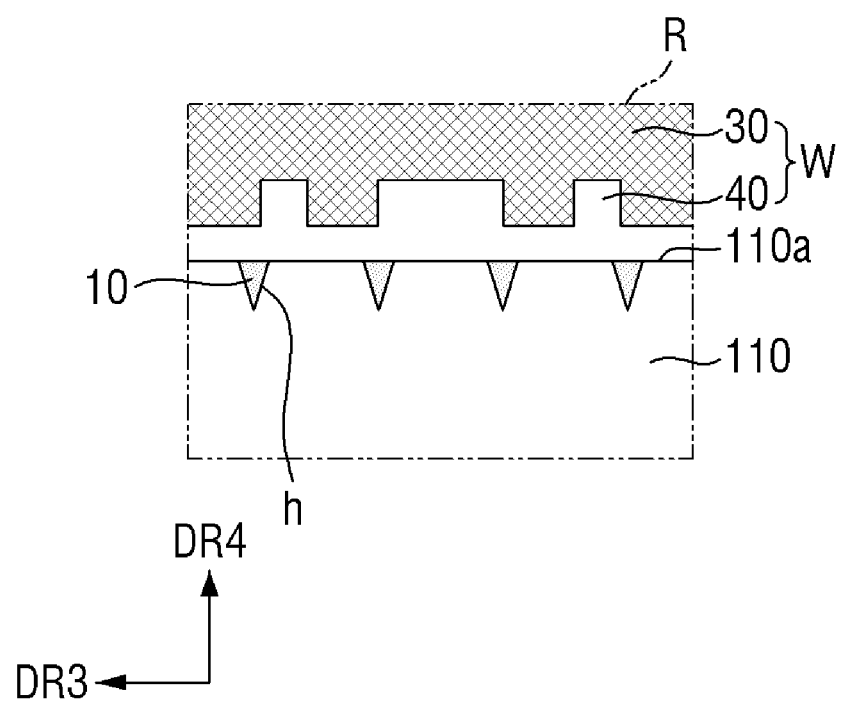
FIG. 6 is an enlarged view of a region R of FIG. 5.
Figure 7:
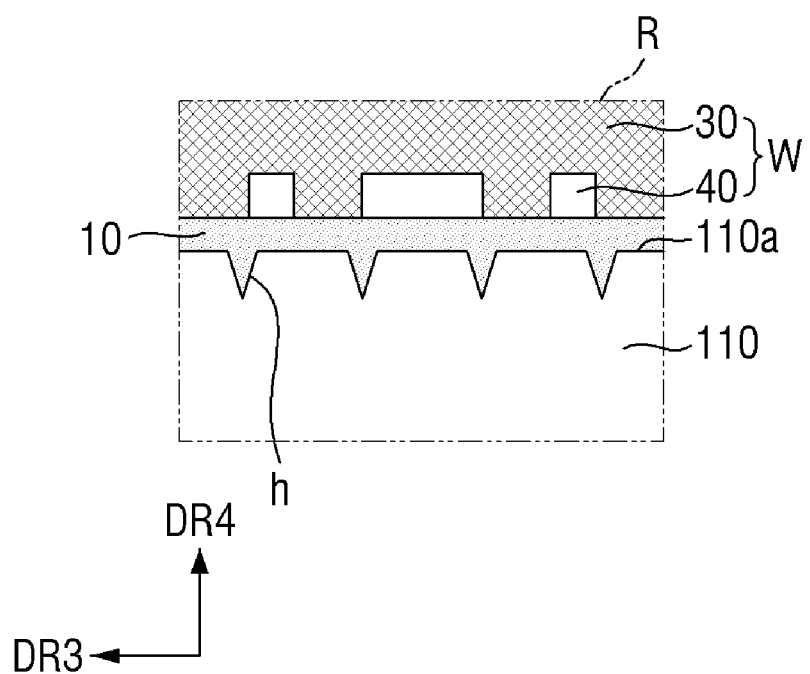
FIG. 7 is an enlarged view of the region R of FIG. 5 for explaining a status of the wafer after the CMP process, according to some embodiments.

FIG. 1 is a plan view for explaining a wafer polishing apparatus according to some embodiments of the present disclosure. FIG. 2 is a cross-sectional view taken along a line A-A' of FIG. 1, according to some embodiments. FIG. 3 is a cross-sectional view for explaining a first fence of a wafer polishing apparatus shown in FIG. 2, according to some embodiments. FIG. 4 is a plan view for explaining a first fence and a second fence of the wafer polishing apparatus shown in FIG. 1, according to some embodiments. FIG. 5 is a cross-sectional view taken along a line B-B' of FIG. 1, according to some embodiments. FIG. 6 is an enlarged view of a region R of FIG. 5. FIG. 7 is an enlarged view of the region R of FIG. 5 for explaining a status of the wafer after the CMP process, according to some embodiments.

Referring to FIGS. 1 to 7, a wafer polishing apparatus according to some embodiments of the present disclosure may include a stage 100, a support 105, a polishing pad 110, a polishing head 120, a first fence 130, a second fence 140, a first nozzle 150, a second nozzle 160, a disc 170, and a disc connection 175.

The wafer polishing apparatus according to some embodiments of the present disclosure is an apparatus that performs a chemical mechanical polishing (CMP) process on the surface of a wafer to polish the surface of the wafer. For example, the wafer W may be a substrate including a semiconductor or non-semiconductor material. The wafer W may include one or more layers formed on the substrate. For example, as shown in FIG. 6, the wafer W may include a first layer 30 that forms a pattern, and a second layer 40 disposed below the first layer 30. For example, each of the first layer 30 and the second layer 40 may include a photoresist, an insulating material, and a conductive material, but the present disclosure is not limited thereto. After the CMP process is performed, the wafer may undergo further CMP and other processes on additional layers, as well as a dicing procedure, so that a device, such as a semiconductor chip, an interposer substrate, or a package substrate, etc., is formed. The completed device may be packaged into a semiconductor device such as a semiconductor package, which may include a package substrate and one or more semiconductor chips (e.g., logic chips or memory chips).

The polishing pad 110 may be disposed on the stage 100. The stage 100 may support the polishing pad 110. The support 105 may be connected to the stage 100. The support 105 may turn the stage 100. As a result, the polishing pad 110 disposed on the stage 100 may be turned. For example, as shown in FIG. 1, the polishing pad 110 may be turned counterclockwise.

The polishing pad 110 may have, for example, a disc shape (e.g., a circular disc shape). The polishing pad 110 may include at its surface polishing particles for polishing the surface of the wafer W. For example, the polishing pad 110 may include an elastic material such as polyurethane having a rough surface.

The polishing pad 110 may include a first region I and a second region II. The first region I of the polishing pad 110 may be a region to which the slurry solution 10 is provided. The second region II of the polishing pad 110 may be a region to which an ultrapure water 20 is provided. The slurry solution 10 may be used to chemically flatten the surface of the wafer W. The slurry solution 10 may be a liquid including chemicals and abrasives. For example, the slurry solution 10 may include fine abrasive particles such as colloidal silica. The first region I of the polishing pad 110 and the second region II of the polishing pad 110 may be formed by and completely separated (e.g., may be isolated from each other) by the first fence 130 and the second fence 140. As used herein, "completely separated" refers to regions separated by physical boundaries formed therebetween, so that any adjacent portions of the regions are separated by a physical boundary. The first region I and the second region II may form respective sections of the full polishing pad, which sections are formed by the first fence 130 and the second fence 140.

The first fence 130 may be disposed on the upper surface 110a (e.g., top surface) of the polishing pad 110. The first fence 130 may extend from the center of the polishing pad 110 toward and up to or past the edge of the polishing pad 110 in a first horizontal direction DR1. As shown in FIG. 1, for example, the first fence 130 may extend beyond an outer peripheral surface of the polishing pad 110. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

For example, the first fence 130 may have a brush shape, or comb shape. For example, the first fence 130 may include a first plurality of protrusions 131 and first connections 132. Each of the first plurality of protrusions 131 may be disposed apart from each other in the first horizontal direction DR1. For example, a space extending in a vertical direction DR4 may be formed between each of the first plurality of protrusions 131. The first connection 132 may be disposed on the first plurality of protrusions 131. The first connection 132 may connect each of the first plurality of protrusions 131. The first connection 132 may include a plurality of individual first connections (e.g., each connecting an adjacent protrusion of the fence) that are continuously connected to each other. The first connection 132 may be a base layer for the first fence 130, and may be described as a connection base.

As shown in FIG. 4, each of the first plurality of protrusions 131 may be disposed perpendicularly to a side wall 132s of the first connection 132 extending in the first horizontal direction DR1. A lower surface of the first fence 130 (e.g., bottom-most surface) may be in contact with the upper surface 110a of the polishing pad 110. For example, lower surfaces of each of the first plurality of protrusions 131 may be in contact with the upper surface 110a of the polishing pad 110. The term "contact," as used herein, refers to a direct connection (i.e., touching) unless the context indicates otherwise.

The second fence 140 may be disposed on the upper surface 110a of the polishing pad 110. The second fence 140 may extend from the center of the polishing pad 110 toward and up to or past the edge of the polishing pad 110 in a second horizontal direction DR2 different from the first horizontal direction DR1. As shown in FIG. 1, for example, the first fence 130 may extend beyond the outer peripheral surface of the polishing pad 110. One end of the second fence 140 may be connected to one end of the first fence 130. For example, in one embodiment, the first fence 130 and the second fence 140 may be integrally formed as a unitary piece, and may be referred together as a fence or fence structure.

For example, the second fence 140 may have a brush shape, or a comb shape. For example, the second fence 140 may include a second plurality of protrusions 141 and a second connection 142. Each of the second plurality of protrusions 141 may be disposed apart from each other in the second horizontal direction DR2. For example, a space extending in the vertical direction DR4 may be formed between each of the second plurality of protrusions 141. The second connection 142 may be disposed on the second plurality of protrusions 141. The second connection 142 may connect each of the second plurality of protrusions 141. The second connection 142 may include a plurality of individual second connections (e.g., each connecting an adjacent protrusion of the fence) that are continuously connected to each other. The second connection 142 may be a base layer for the second fence 140.

As shown in FIG. 4, each of the second plurality of protrusions 141 may be disposed perpendicularly to a side wall 142s of the second connection 142 extending in the second horizontal direction DR2. A lower surface of the second fence 140 may be in contact with the upper surface 110a of the polishing pad 110. For example, the lower surfaces of each of the second plurality of protrusions 141 may be in contact with the upper surface 110a of the polishing pad 110.

The polishing head 120 may be disposed on the first region I of the polishing pad 110. The polishing head 120 may grip the wafer W (e.g., using adsorption or other methods). For example, the wafer W may be loaded onto the polishing head 120. The polishing head 120 may press the wafer W against the upper surface 110a of the polishing pad 110. The polishing head 120 may turn. The wafer W gripped by the polishing head 120 may turn in a state of being in contact with the upper surface 110a of the polishing pad 110. The wafer W may be mechanically polished by sliding contact with the upper surface 110a of the polishing pad 110 in the presence of the slurry solution 10 on the first region I of the polishing pad 110.

The first nozzle 150 may be disposed on the first region I of the polishing pad 110. For example, the first nozzle 150 may be disposed on one side wall of the first fence 130. The first nozzle 150 may provide the slurry solution 10 onto the first region I of the polishing pad 110. The second nozzle 160 may be disposed on the second region II of the polishing pad 110. For example, the second nozzle 160 may be disposed on one side wall of the second fence 140. The second nozzle 160 may provide the ultrapure water 20 onto the second region II of the polishing pad 110.

While the polishing pad 110 turns counterclockwise, the slurry solution 10 provided from the first nozzle 150 onto the first region I of the polishing pad 110 may move to the downstream part of the polishing head 120 to polish the surface of the wafer W. For example, as the polishing pad 110 turns counterclockwise, the deposited slurry solution 10 moves along with the polishing pad 110, away from the first nozzle 150, to fill the first region I of the polishing pat 110 and to eventually reach the polishing head 120 where the wafer W is attached. Subsequently, by continued turning of the polishing pad 110, the slurry solution 10 used for polishing the surface of the wafer W may be brought into contact with the second fence 140. The slurry solution 10 brought into contact with the second fence 140 may be discharged to the outside of the polishing pad 110 along the side wall of the second fence 140. This makes it possible to minimize the slurry solution 10 remaining on the second region II of the polishing pad 110.

Further, while the polishing pad 110 turns counterclockwise, the ultrapure water 20 provided from the second nozzle 160 onto the second region II of the polishing pad 110 may wash the upper surface 110a of the second region II of the polishing pad 110. As a result, the slurry solution 10 remaining on the second region II of the polishing pad 110 may be removed. Subsequently, the ultrapure water 20 may be brought into contact with the first fence 130 by continued turning of the polishing pad 110. The ultrapure water 20 brought into contact with the first fence 130 may be discharged to the outside of the polishing pad 110 along the side wall of the first fence 130. In the manner described above, the first nozzle 150 is adjacent to the first fence 130 on one side of the first fence 130 and is ahead of the first fence 130 in a rotation direction of the polishing pad 110, and the second nozzle 160 is adjacent to the second fence 140 on one side of the second fence 140 and is ahead of the second fence 140 in the rotation direction of the polishing pad 110.

The disc 170 may be disposed on the second region II of the polishing pad 110. For example, the polishing head 120 may be spaced apart from the disc 170 in a third horizontal direction DR3 different from the first and second horizontal direction DR1 and DR2. In a radial direction, the disc 170 may be positioned 180 degrees from the polishing head 120.

The disc 170 may form a plurality of grooves h on the upper surface 110a of the polishing pad 110. The disc 170 may include a disc pad 172, and a plurality of contact parts 171 protruding below the disc pad 172. The disc pad 172 is connected to the disc connection 175 and may be fixed onto the second region II of the polishing pad 110. The disc 170 may have a rectangular shape as depicted in FIG. 1, or may have other shapes (e.g., circular, oval, or other). It should be noted that the first region I and second region II of the polishing pad 110 are regions that remain fixed as the polishing pad rotates. That is, they are regions, from a plan view, associated with the location where the polishing pad is disposed.

The lower parts of each of the plurality of contact parts 171 may be in contact with the upper surface 110a of the polishing pad 110. For example, lower distal ends of each of the plurality of contact parts 171 may be formed sharply. The plurality of contact parts 171 may be described as bristles. While the polishing pad 110 turns, the lower distal ends of each of the plurality of contact parts 171 may form a plurality of grooves h on the upper surface 110a of the polishing pad 110. For example, the lower distal ends of each of the plurality of contact parts 171 may be disposed inside the plurality of grooves h.

For example, each of the plurality of grooves h may be formed in the form of a circular line on the upper surface 110a of the polishing pad 110. The slurry solution 10 may exist inside the plurality of grooves h formed in the first region I of the polishing pad 110. The ultrapure water 20 may exist inside the plurality of grooves h formed in the second region II of the polishing pad 110.

As shown in FIG. 6, the slurry solution 10 may also exist inside the plurality of grooves h formed between the polishing pad 110 and the lower surface of the wafer W. The wafer W may be chemically polished by the slurry solution 10 existing inside the plurality of grooves h on the first region I of the polishing pad 110.

The surface of the wafer W may be polished by mechanical polishing by turning of each of the polishing pad 110 and the wafer W, and chemical polishing with the slurry solution 10 existing inside the plurality of grooves h. For example, the lower surface of the wafer W may be etched to the same thickness (e.g. to be a flat planar surface), while the polishing process is in progress. For example, referring to FIGS. 6 and 7, a part of the second layer 40 formed on the lower surface of the wafer W may be etched through the polishing process. Further, a part of the first layer 30 may also be etched through the polishing process. For example, after the polishing process is completed, the lower surface of the first layer 30 may be exposed, as shown in FIG. 7.

The wafer polishing apparatus according to some embodiments of the present disclosure may completely separate (e.g., may isolate) the upper surface 110a of the polishing pad 110 into a first region I in which the polishing process on the surface of the wafer W is performed, and a second region II in which the disc 170 is disposed, by the use of the first fence 130 and the second fence 140. The slurry solution 10 may exist in the first region I, and the ultrapure water 20 may exist in the second region II. Therefore, the wafer polishing apparatus according to some embodiments of the present disclosure may reduce the variability of the polishing process on the wafer W by preventing the disc 170 from being etched by the slurry solution 10, and may increase the replacement cycle of the disc 170 to improve productivity.

Hereinafter, a method for fabricating a semiconductor device using a wafer polishing apparatus according to some embodiments of the present disclosure will be described referring to FIGS. 1 to 8.

Figure 8:
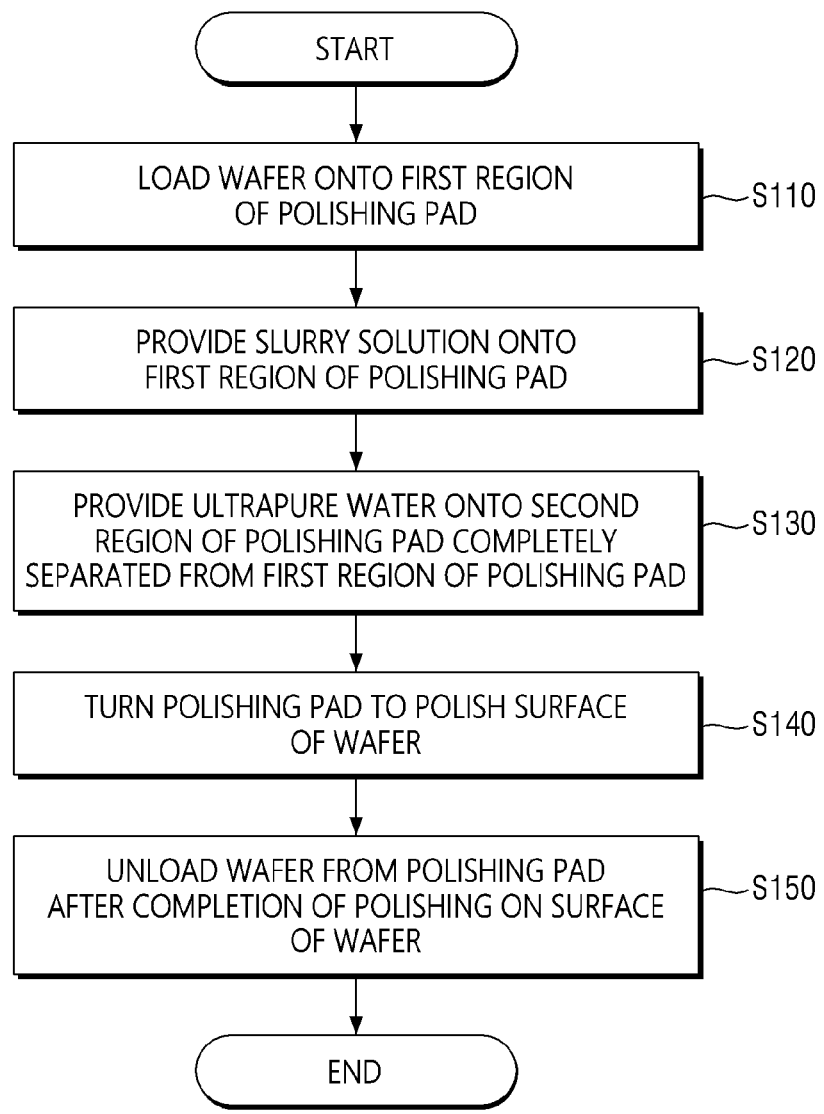
FIG. 8 is a flowchart for explaining a method for fabricating a semiconductor device using the wafer polishing apparatus according to some embodiments of the present disclosure.

FIG. 8 is a flowchart for explaining a method for fabricating a semiconductor device using a wafer polishing apparatus according to some embodiments of the present disclosure.

Referring to FIGS. 1 to 8, it is possible to provide the polishing pad 110 completely separated into the first region I and the second region II by the first fence 130 and the second fence 140. For example, the first fence 130 and second fence 140 may remain static in the same position above the location where the polishing pad 110 is located while the polishing pad 110 rotates. Physically separated regions may be formed in relation to the polishing pad 110 by the first fence 130 and second fence 140. Herein, when a "first region I" of the polishing pad is described, and similarly when a "second region II" of the polishing pad is described, this refers to a static region in relation to the top-down view of the polishing pad location. For example, when the polishing pad rotates, the first region I and the second region II remain the same. The wafer W may be loaded onto the first region I of the polishing pad 110 (S110). The wafer W is gripped below the polishing head 120 and loaded onto the first region I of the polishing pad 110.

Subsequently, the slurry solution 10 may be provided onto the first region I of the polishing pad 110 (S120). The slurry solution 10 may be provided onto the first region I of the polishing pad 110 through the first nozzle 150. Subsequently, the ultrapure water 20 may be provided onto the second region II of the polishing pad 110 (S130). The ultrapure water 20 may be provided onto the second region II of the polishing pad 110 through the second nozzle 160.

Subsequently, the polishing pad 110 may be turned (e.g., rotated) to polish the surface of the wafer W (S140). Specifically, while the polishing pad 110 turns counterclockwise, the surface of the wafer W may be polished, using the slurry solution 10 and the polishing pad 110, on the first region I of the polishing pad 110. It should be noted that the entire first region I, or at least the first region I from the first nozzle 150 past the area where the polishing head 120 is located, may be coated with the slurry solution 10 before the polishing head is lowered to make contact between the attached wafer and the polishing pad 110. Subsequently, by turning of the polishing pad 110, the slurry solution 10 used for polishing the surface of the wafer W may be brought into contact with the second fence 140. The slurry solution 10 brought into contact with the second fence 140 may be discharged to the outside of the polishing pad 110 along the side wall of the second fence 140. Though not shown, a dish or other collection receptacle may be positioned below the outside of the area of the polishing pad 110 and may collect the discharged slurry solution 10 for disposal.

Subsequently, by turning of the polishing pad 110, any remaining slurry solution 10 (e.g., that remains after passing through the second fence 140) may be washed using the ultrapure water 20, on the second region II of the polishing pad 110 from which most of the slurry solution 10 has been removed. Subsequently, the ultrapure water 20, which may contain small amounts of remaining slurry solution 10, may be brought into contact with the first fence 130 by turning of the polishing pad 110. The ultrapure water 20 brought into contact with the first fence 130 may be discharged to the outside of the polishing pad 110 along the side wall of the first fence 130. The surface of the wafer W may be polished by such a polishing method.

Although it has been described that the providing step (S120) of the slurry solution 10, the providing step (S130) of the ultrapure water (20), and the polishing step (S140) of the surface of the wafer W are sequentially performed, this is merely for convenience of explanation, and the present disclosure is not limited thereto. In some other embodiments, the providing step (S120) of the slurry solution 10, the providing step (S130) of the ultrapure water 20, and the polishing step (S140) of the surface of the wafer W may be performed simultaneously.

Next, after the polishing of the surface of the wafer W is completed, the wafer W may be unloaded from the polishing pad 110 (S150). The polishing process on the wafer W used in the fabricating process of the semiconductor device may be performed through such a fabricating process. After the polishing process is performed, the wafer may undergo further deposition, patterning, and polishing, and other processes on additional layers, as well as a dicing procedure, so that a device, such as a semiconductor chip, an interposer substrate, or a package substrate, etc., is formed. The completed device may be packaged into a semiconductor device such as a semiconductor package, which may include a package substrate and one or more semiconductor chips (e.g., logic chips or memory chips).

Hereinafter, a wafer polishing apparatus according to some other embodiments of the present disclosure will be described referring to FIG. 9. Differences from the wafer polishing apparatus shown in FIGS. 1 to 7 will be mainly described.

Figure 9:
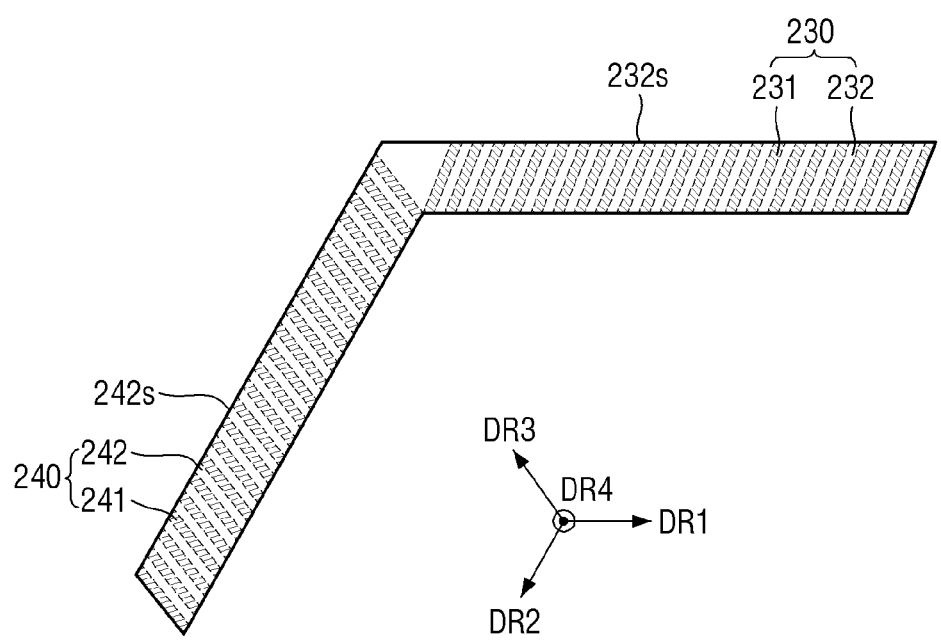
FIG. 9 is a plan view for explaining a first fence and a second fence of a wafer polishing apparatus according to some other embodiments of the present disclosure.

FIG. 9 is a plan view for explaining a first fence and a second fence of the wafer polishing apparatus according to some other embodiments of the present disclosure.

Referring to FIG. 9, in the wafer polishing apparatus according to some other embodiments of the present disclosure, each of a first plurality of protrusions 231 included in a first fence 230 may be disposed to have an inclination, and each of a second plurality of protrusions 241 included in a second fence 240 may be disposed to have an inclination.

For example, each of the first plurality of protrusions 231 may be disposed to form a non-perpendicular angle (e.g., an acute angle) with a side wall 232s of a first connection 232 extending in the first horizontal direction DR1. Further, each of the second plurality of protrusions 241 may be disposed to form a non-perpendicular angle (e.g., an acute angle) with a side wall 242s of a second connection 242 extending in the second horizontal direction DR2.

Hereinafter, a wafer polishing apparatus according to still some other embodiments of the present disclosure will be described referring to FIGS. 10 and 11. Differences from the wafer polishing apparatus shown in FIGS. 1 to 7 will be mainly described.

Figure 10:
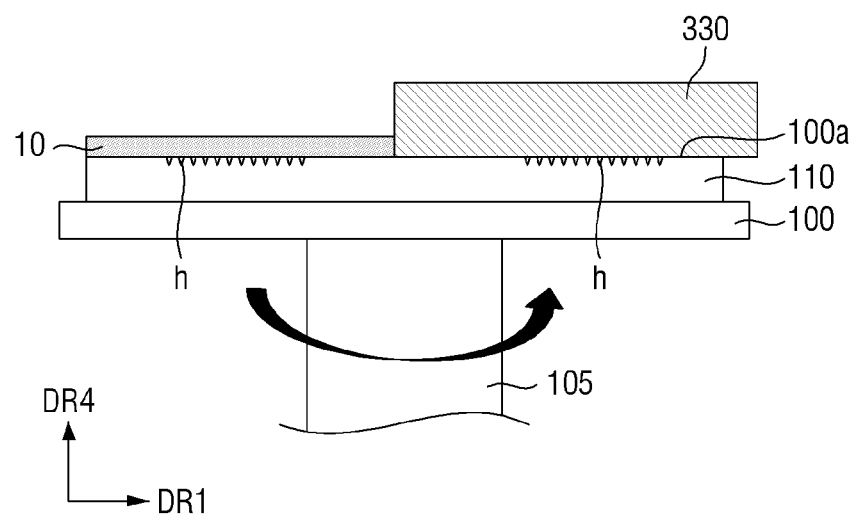
FIG. 10 is a cross-sectional view for explaining a wafer polishing apparatus according to still some other embodiments of the present disclosure.

FIG. 10 is a cross-sectional view for explaining a wafer polishing apparatus according to still some other embodiments of the present disclosure. FIG. 11 is a diagram for explaining a first fence of the wafer polishing apparatus shown in FIG. 10.

Figure 11:
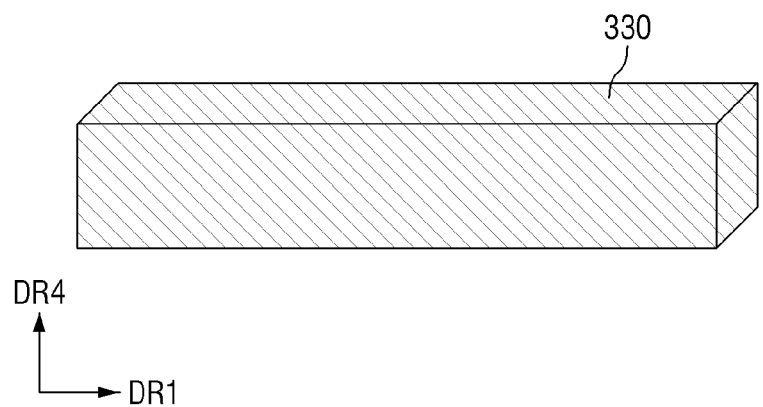
FIG. 11 is a diagram for explaining a first fence of the wafer polishing apparatus shown in FIG. 10, according to some embodiments.

Referring to FIGS. 10 and 11, in the wafer polishing apparatus according to some other embodiments of the present disclosure, a lower surface of the first fence 330 may have a planar shape.

The lower surface of the first fence 330 having a planar shape may be in contact with the upper surface 110a of the polishing pad 110. For example, the first fence 330 may have a hexahedral shape extending in the first horizontal direction DR1 as shown in FIG. 11. However, the present disclosure is not limited thereto. In some other embodiments, the first fence 330 may have a polyhedral shape other than a hexahedron in which the lower surface of the first fence 330 has a planar shape. Terms such as "same," "equal," "planar," "coplanar," "parallel," and "perpendicular," as used herein encompass identicality or near identicality including variations that may occur, for example, due to manufacturing processes. The term "substantially" may be used herein to emphasize this meaning, unless the context or other statements indicate otherwise.

Although not shown in FIGS. 10 and 11, a second fence (not shown) corresponding to the second fence (140 of FIG. 1) shown in FIG. 1 may extend in a second horizontal direction (DR2 of FIG. 1). The second fence (not shown) may have a shape similar to that of the first fence 330. Therefore, a detailed description of the second fence (not shown) will be omitted. Note, however, that one of first fence and second fence may have a different structure from each other, such that one fence has a structure such as shown or described in one of FIGS. 4, 9, and 10-11, and the other fence has a structure from another one of the examples of FIGS. 4, 9, and 10-11.

Hereinafter, a wafer polishing apparatus according to still some other embodiments of the present disclosure will be described referring to FIGS. 10 and 12. Differences from the wafer polishing apparatus shown in FIGS. 1 to 7 will be mainly described.

Figure 12:
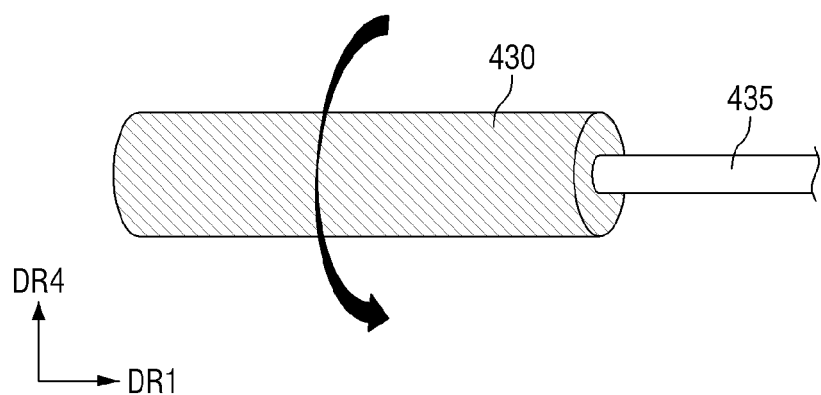
FIG. 12 is a diagram for explaining a first fence of a wafer polishing apparatus according to still some other embodiments of the present disclosure.

FIG. 12 is a diagram for explaining a first fence of a wafer polishing apparatus according to still some other embodiments of the present disclosure.

Referring to FIGS. 10 and 12, in the wafer polishing apparatus according to some other embodiments of the present disclosure, a first fence 430 may have a cylindrical shape extending in the first horizontal direction DR1.

A lower side wall of the first fence 430 having a cylindrical shape may be in contact with the upper surface 110a of the polishing pad 110. The first fence 430 may turn on the upper surface 110a of the polishing pad 110. For example, the first fence 430 may be turned, using a fence rotary shaft 435 connected to a distal end of the first fence 430 as a rotary shaft. For example, while the polishing pad 110 turns, the first fence 430 may be turned by the frictional force with the upper surface 110a of the polishing pad 110.

Although not shown in FIGS. 10 and 12, a second fence (not shown) corresponding to the second fence (140 of FIG. 1) shown in FIG. 1 may extend in the second horizontal direction (DR2 of FIG. 1). The second fence (not shown) may have a shape similar to that of the first fence 430, or different, as discussed above. Therefore, a detailed description of the second fence (not shown) will be not be provided.

Hereinafter, a wafer polishing apparatus according to still some other embodiments of the present disclosure will be described referring to FIG. 13. Differences from the wafer polishing apparatus shown in FIGS. 1 to 7 will be mainly described.

Figure 13:
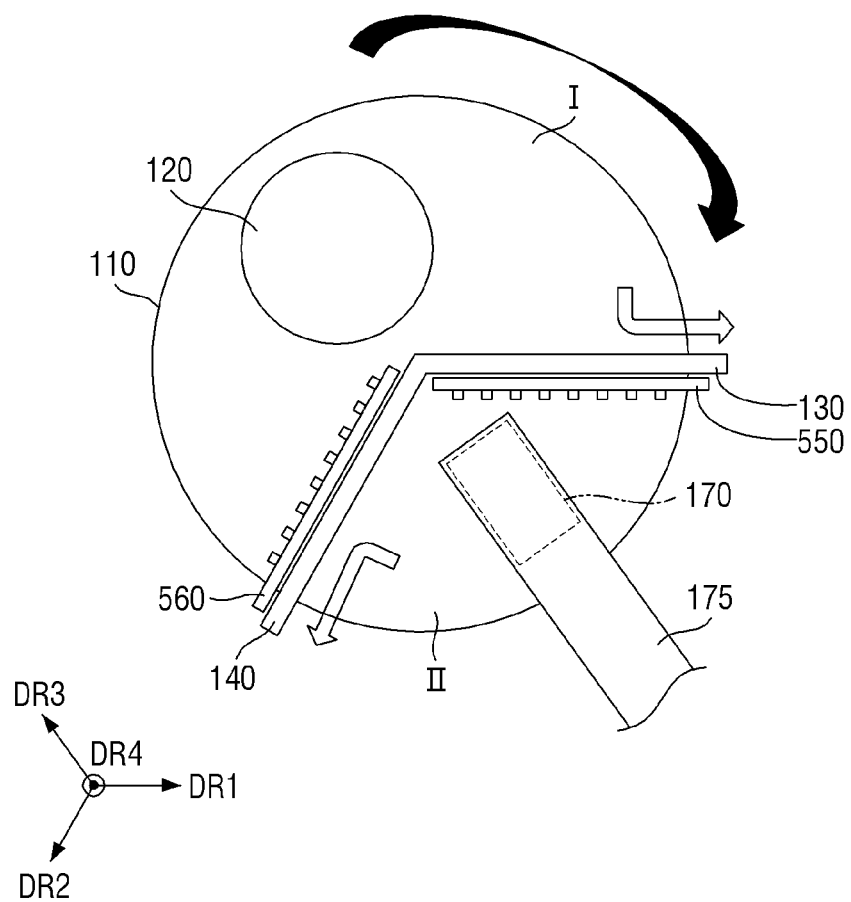
FIG. 13 is a plan view for explaining a wafer polishing apparatus according to some other embodiment of the present disclosure.

FIG. 13 is a plan view for explaining the wafer polishing apparatus according to some other embodiment of the present disclosure.

Referring to FIG. 13, in the wafer polishing apparatus according to some other embodiments of the present disclosure, the polishing pad 110 may turn clockwise.

A first nozzle 550 may be disposed on the second region II of the polishing pad 110. For example, the first nozzle 550 may be disposed on the other side wall of the first fence 130. The first nozzle 550 may provide ultrapure water 20 onto the second region II of the polishing pad 110. The second nozzle 560 may be disposed on the first region I of the polishing pad 110. For example, the second nozzle 560 may be disposed on the other side wall of the second fence 140. The second nozzle 560 may provide the slurry solution 10 onto the first region I of the polishing pad 110.

While the polishing pad 110 turns clockwise, the slurry solution (10 of FIG. 5) provided onto the first region I of the polishing pad 110 from the second nozzle 560 moves to the lower part of the polishing head 120, and may polish the surface of the wafer (W of FIG. 5). Next, by turning of the polishing pad 110, the slurry solution (10 of FIG. 5) used for polishing the surface of the wafer (W of FIG. 5) may be brought into contact with the first fence 130. The slurry solution (10 of FIG. 5) brought into contact with the first fence 130 may be discharged to the outside of the polishing pad 110 along the side wall of the first fence 130.

Further, while the polishing pad 110 turns clockwise, the ultrapure water (20 of FIG. 5) provided onto the second region II of the polishing pad 110 from the first nozzle 550 may wash the upper surface 110a of the second region II of the polishing pad 110. After that, the ultrapure water (20 of FIG. 5) may be brought into contact with the second fence 140 by turning of the polishing pad 110. The ultrapure water (20 of FIG. 5) brought into contact with the second fence 140 may be discharged to the outside of the polishing pad 110 along the side wall of the second fence 140. In this manner, the first nozzle 550 is adjacent to the first fence 130 on one side of the first fence 130 and is ahead of the first fence 130 in a rotation direction of the polishing pad 110, and the second nozzle 560 is adjacent to the second fence 140 on one side of the second fence 140 and is ahead of the second fence 140 in the rotation direction of the polishing pad 110.

Hereinafter, a wafer polishing apparatus according to still some other embodiments of the present disclosure will be described referring to FIGS. 14 and 15. Differences from the wafer polishing apparatus shown in FIGS. 1 to 7 will be mainly described.

Figure 14:
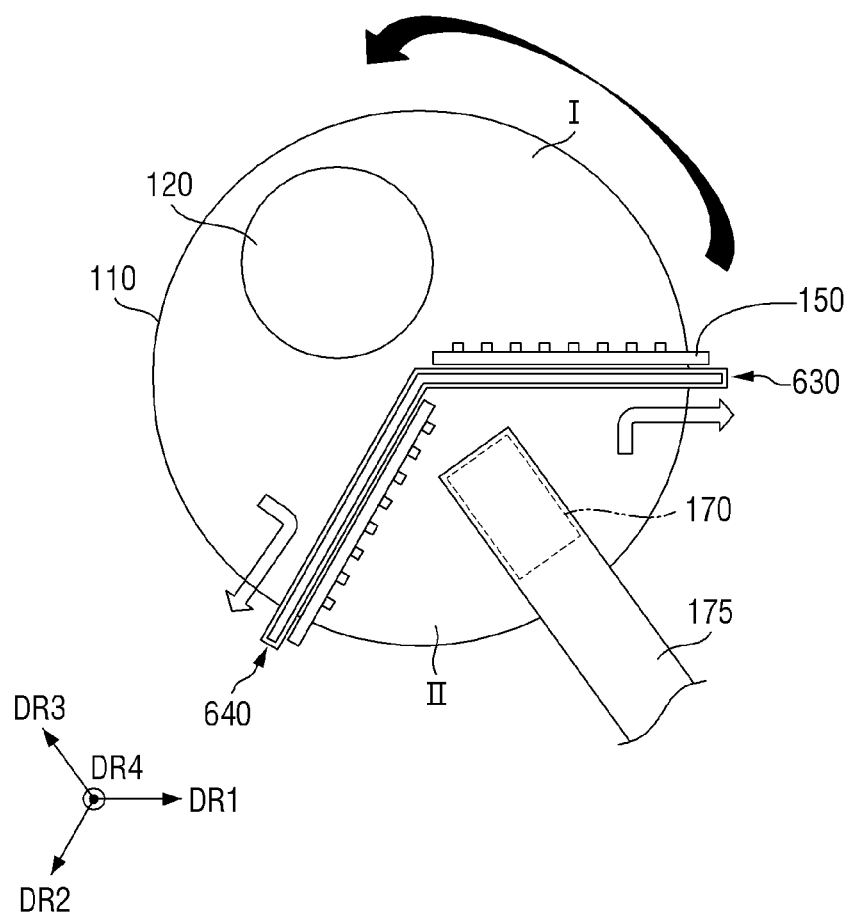
FIG. 14 is a plan view for explaining a wafer polishing apparatus according to still some other embodiments of the present disclosure.

FIG. 14 is a plan view for explaining a wafer polishing apparatus according to still some other embodiments of the present disclosure. FIG. 15 is a plan view for explaining a first fence and a second fence of the wafer polishing apparatus shown in FIG. 14.

Figure 15:
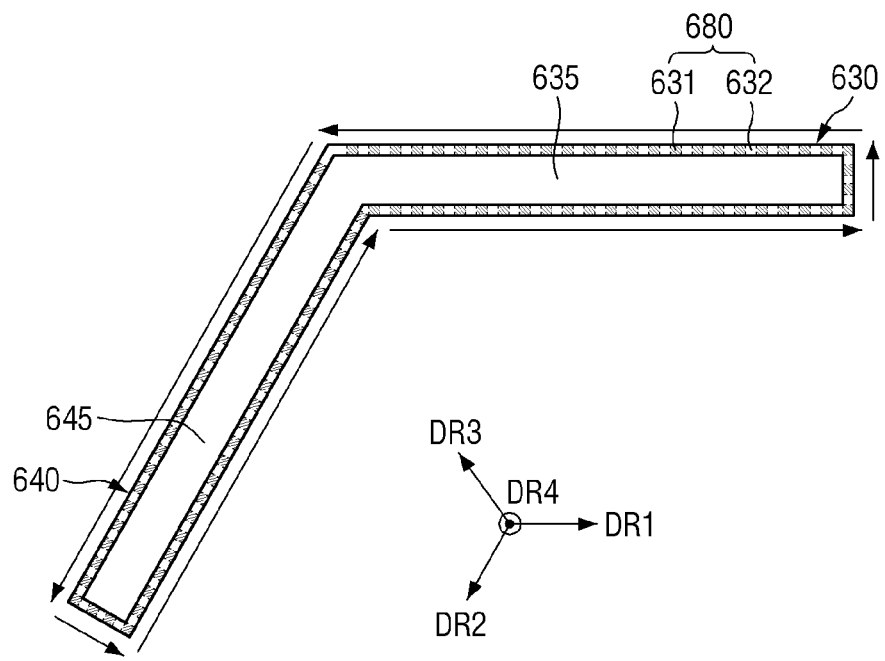
FIG. 15 is a plan view for explaining the first fence and the second fence of the wafer polishing apparatus shown in FIG. 14.

Referring to FIGS. 14 and 15, in the wafer polishing apparatus according to still some other embodiments of the present disclosure, each of a first fence 630 and a second fence 640 may have a structure similar to that of a conveyor belt.

For example, the first fence 630 may include a first guide frame 635 and a belt unit 680. The second fence 640 may include a second guide frame 645 and a belt unit 680. For example, the first fence 630 and the second fence 640 may be integrally formed.

The first guide frame 635 may extend from the center of the polishing pad 110 toward the edge of the polishing pad 110 in the first horizontal direction DR1. As shown in FIG. 14, for example, the first guide frame 635 may extend beyond the outer peripheral surface of the polishing pad 110.

The second guide frame 645 may extend from the center of the polishing pad 110 toward the edge of the polishing pad 110 in the second horizontal direction DR2. As shown in FIG. 14, for example, the second guide frame 645 may extend beyond the outer peripheral surface of the polishing pad 110. One end of the second guide frame 645 may be connected to one end of the first guide frame 635. For example, the first guide frame 635 and the second guide frame 645 may be integrally formed.

The belt unit 680 may be disposed along the side walls of each of the first guide frame 635 and the second guide frame 645. The belt unit 680 disposed on the side wall of the first guide frame 635 may be connected to the belt unit 680 disposed on the side wall of the second guide frame 645. The belt unit 680 may move along the side walls of each of the first guide frame 635 and the second guide frame 645. The belt unit 680 may circulate along the side walls of each of the first guide frame 635 and the second guide frame 645.

A cross-sectional shape of the belt unit 680 taken in the vertical direction DR4 may have a structure similar to a cross-sectional shape of the first fence (130 of FIG. 3) shown in FIG. 3. For example, the belt unit 680 may have a brush shape. For example, the belt unit 680 may include a plurality of protrusions 631 and connection 632. Each of the plurality of protrusions 631 may be disposed apart from each other. For example, a space extending in the vertical direction DR4 may be formed between each of the plurality of protrusions 631. The connection 632 may be disposed on the plurality of protrusions 631. The connection 632 may connect each of the plurality of protrusions 631.

In concluding the detailed description, those skilled in the art will appreciate that many variations and modifications may be made to the preferred embodiments without substantially departing from the principles of the present disclosure. Therefore, the disclosed preferred embodiments of the disclosure are used in a generic and descriptive sense only and not for purposes of limitation.

What is claimed is:

1. An apparatus for polishing a wafer, the apparatus comprising:
a polishing pad which includes a first region to which a slurry solution is provided, and a second region to which an ultrapure water is provided;
a first fence which is disposed on the polishing pad, and extends from a center of the polishing pad toward an edge of the polishing pad in a first horizontal direction;
a second fence which is disposed on the polishing pad, and extends from the center of the polishing pad toward the edge of the polishing pad in a second horizontal direction different from the first horizontal direction; and
a polishing head which is disposed on the first region and onto which a wafer is loaded,
wherein the first and second regions are formed by and separated by the first and second fences, and
wherein the first fence includes:
a first guide frame extending in the first horizontal direction, and
a belt unit disposed on and which moves along and encircles a side wall of the first guide frame,
wherein the side wall connects between a top and bottom of the first guide frame.

2. The apparatus for polishing the wafer of claim 1, further comprising:
a first nozzle which is disposed on one side of the first fence on the first region, and provides the slurry solution onto the first region; and
a second nozzle which is disposed on one side of the second fence on the second region, and provides the ultrapure water onto the second region.

3. The apparatus for polishing the wafer of claim 1, further comprising:
a disc which is disposed on the second region and is configured to form a plurality of grooves on an upper surface of the polishing pad,
wherein the disc includes a plurality of contact parts that are in contact with the upper surface of the polishing pad, and to form the plurality of grooves.

4. The apparatus for polishing the wafer of claim 1, wherein one end of the first fence and one end of the second fence are connected to each other.

5. The apparatus for polishing the wafer of claim 1, wherein:
the belt unit includes a plurality of protrusions spaced apart from each other.

6. The apparatus for polishing the wafer of claim 5, wherein the second fence includes a second guide frame that extends in the second horizontal direction and is connected to the first guide frame, and
wherein the belt unit moves along the side wall of the first guide frame and a side wall of the second guide frame.

7. An apparatus for polishing a wafer, the apparatus comprising:
a polishing pad which includes a first region and a second region completely separated from the first region;
a fence which is disposed on the polishing pad and separates the first region and the second region;
a first nozzle configured to provide a slurry solution to the first region;
a second nozzle configured to provide an ultrapure water to the second region;
a polishing head which is disposed on the first region and onto which a wafer is loaded; and a disc which is disposed on the second region and is configured to form a plurality of grooves on an upper surface of the polishing pad, wherein the fence includes:

a first guide frame extending in a first horizontal direction, and a belt unit disposed on and which moves along and encircles a side wall of the first guide frame, wherein the side wall connects between a top and bottom of the first guide frame.

8. The apparatus for polishing the wafer of claim 7, wherein the fence includes:

a first fence extending from a center of the polishing pad toward an edge of the polishing pad in a the first horizontal direction, and a second fence extending from the center of the polishing pad toward the edge of the polishing pad in a second horizontal direction different from the first horizontal direction.

9. The apparatus for polishing the wafer of claim 8, wherein the belt unit includes a plurality of protrusions spaced apart from each other.

10. The apparatus for polishing the wafer of claim 8, wherein one end of the first fence and one end of the second fence are connected to each other.

11. The apparatus for polishing the wafer of claim 7, wherein the disc includes a plurality of contact parts that are in contact with the upper surface of the polishing pad, and that are configured to form the plurality of grooves.

* * * * *